United States Patent
Takahashi et al.

(10) Patent No.: US 12,392,029 B2
(45) Date of Patent: Aug. 19, 2025

(54) TITANIUM NITRIDE FILM FORMING METHOD AND TITANIUM NITRIDE FILM FORMING APPARATUS

(71) Applicant: Tokyo Electron Limited, Tokyo (JP)

(72) Inventors: Tsuyoshi Takahashi, Nirasaki (JP); Seokhyoung Hong, Hwaseong-si (KR); Kensuke Higuchi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 573 days.

(21) Appl. No.: 17/661,577

(22) Filed: May 2, 2022

(65) Prior Publication Data

US 2022/0356565 A1  Nov. 10, 2022

(30) Foreign Application Priority Data

May 10, 2021 (JP) .................................. 2021-079724
Feb. 18, 2022 (JP) .................................. 2022-024043

(51) Int. Cl.

| | |
|---|---|
| *C23C 16/34* | (2006.01) |
| *C23C 16/455* | (2006.01) |
| *C23C 16/52* | (2006.01) |
| *H01L 21/285* | (2006.01) |
| *H01L 21/768* | (2006.01) |

(52) U.S. Cl.
CPC ........ *C23C 16/34* (2013.01); *C23C 16/45553* (2013.01); *C23C 16/52* (2013.01); *H01L 21/28568* (2013.01); *H01L 21/76883* (2013.01)

(58) Field of Classification Search
CPC ......... H01L 21/76883; H01L 21/28568; C23C 16/52; C23C 16/45553; C23C 16/34
See application file for complete search history.

(56) References Cited

FOREIGN PATENT DOCUMENTS

| JP | H06-188205 A | 7/1994 | |
|---|---|---|---|
| JP | 2013040398 A | * 2/2013 | |
| JP | 2018-066050 A | 4/2018 | |
| JP | 2018188724 A | * 11/2018 | ............... B05D 1/34 |
| KR | 10-2020-0115208 A | 10/2020 | |
| KR | 10-2020-0117027 A | 10/2020 | |
| KR | 10-2021-0044176 A | 4/2021 | |

* cited by examiner

*Primary Examiner* — Kelly M Gambetta
(74) *Attorney, Agent, or Firm* — Armstrong Teasdale LLP

(57) ABSTRACT

A method of forming a titanium nitride film includes: forming the titanium nitride film by alternately repeating supplying a raw material gas, which contains a titanium compound including chlorine and titanium, to a substrate accommodated in a processing container, and supplying a reaction gas, which contains a nitrogen compound including nitrogen and reacts with the titanium compound to form titanium nitride, to the substrate, wherein the forming the titanium nitride film is executed under a condition in which a pressure in the processing container is set within a range of 2.7 kPa to 12.6 kPa so that a specific resistance of the titanium nitride film becomes 57 micro-ohm-cm or less.

12 Claims, 10 Drawing Sheets

FIG. 3
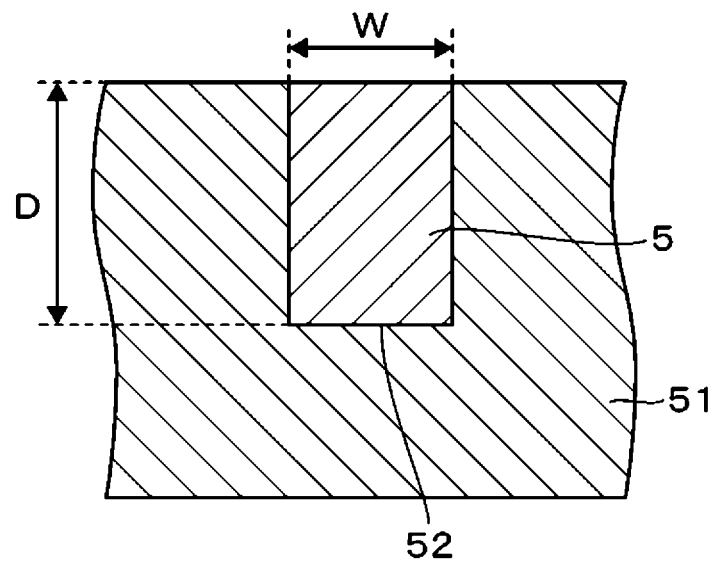
Annealing process
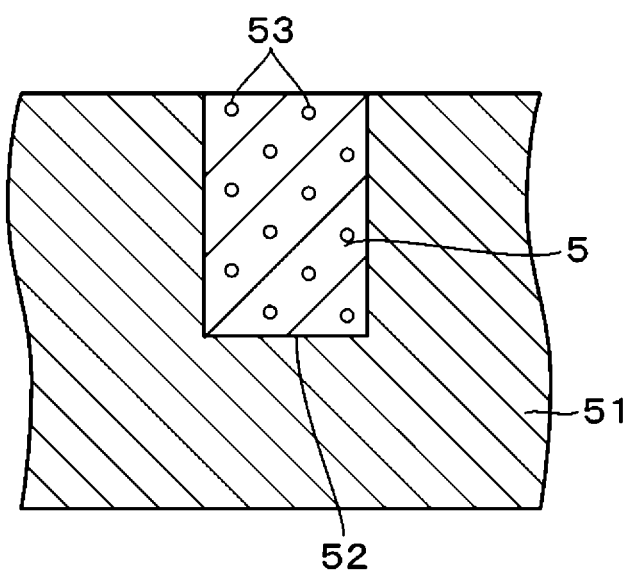

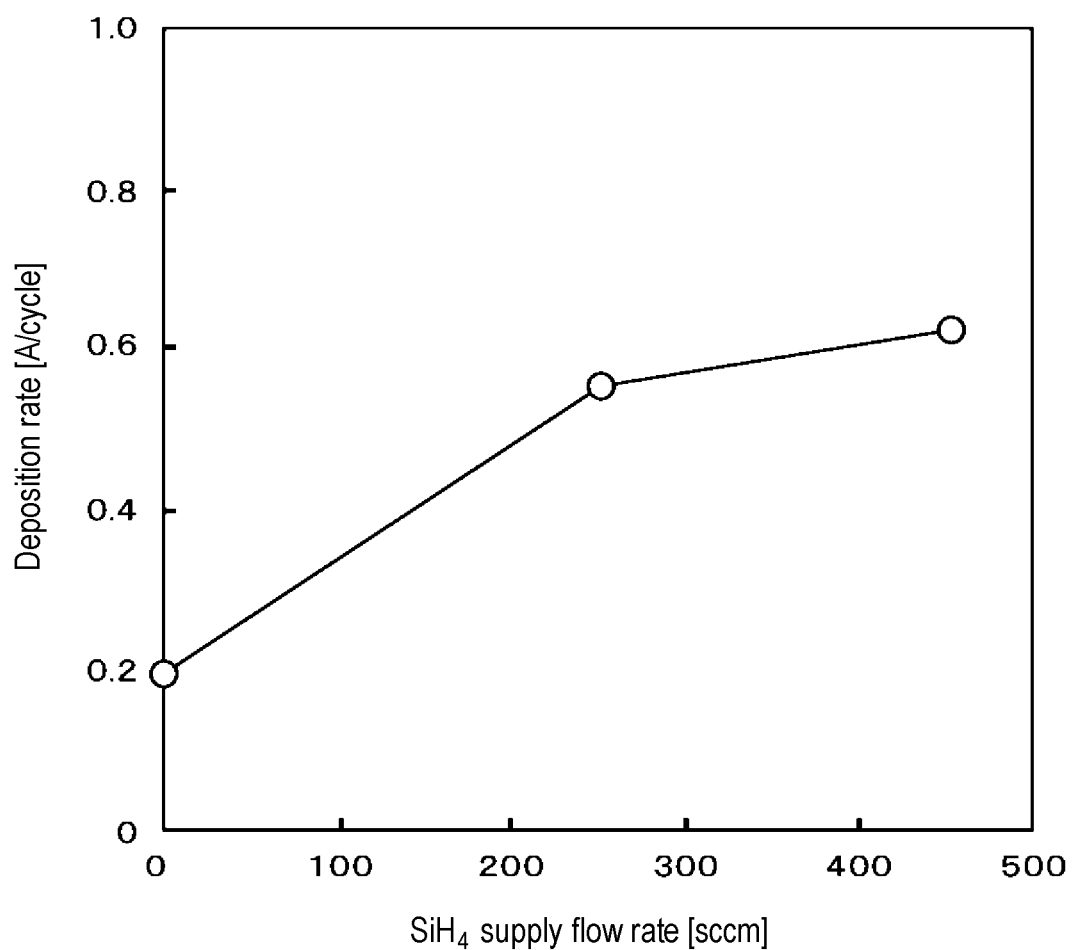

TITANIUM NITRIDE FILM FORMING METHOD AND TITANIUM NITRIDE FILM FORMING APPARATUS

CROSS-REFERENCE TO RELATED APPLICATIONS

This application is based upon and claims the benefit of priority from Japanese Patent Application No. 2021-079724, filed on May 10, 2021, and Japanese Patent Application No. 2022-024043, filed on Feb. 18, 2022, the entire contents of which are incorporated herein by reference.

TECHNICAL FIELD

The present disclosure relates to a titanium nitride film forming method and a titanium nitride film forming apparatus.

BACKGROUND

In manufacturing a semiconductor device, a titanium nitride (TiN) film is used for various purposes. The TiN film is formed by using a titanium-containing gas such as titanium tetrachloride ($TiCl_4$) gas or the like and a nitrogen-containing gas such as ammonia ($NH_3$) gas or the like as film forming gases.

Regarding the TiN film, Patent Document 1 discloses a technique of forming a film by an atomic layer deposition (ALD) method using $TiCl_4$ gas and $NH_3$ gas under a pressure of 1.3 kPa (10 Torr) or less. In addition, Patent Document 2 discloses a technique of forming a film by a chemical vapor deposition (CVD) method using the above-mentioned gases under a pressure set within a range of $10^{-3}$ Torr to several tens of Torr.

PRIOR ART DOCUMENTS

Patent Documents

Patent Document 1: Japanese Laid-Open Patent Publication No. 2018-66050
Patent Document 2: Japanese Laid-Open Patent Publication No. H6-188205

SUMMARY

According to one embodiment of the present disclosure, there is provided a method of forming a titanium nitride film including: forming the titanium nitride film by alternately repeating supplying a raw material gas, which contains a titanium compound including chlorine and titanium, to a substrate accommodated in a processing container, and supplying a reaction gas, which contains a nitrogen compound including nitrogen and reacts with the titanium compound to form titanium nitride, to the substrate, wherein the forming the titanium nitride film is executed under a condition in which a pressure in the processing container is set within a range of 2.7 kPa to 12.6 kPa so that a specific resistance of the titanium nitride film becomes 57 micro-ohm-cm or less.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 3 is a vertical cross-sectional side view showing a titanium nitride film formed on one surface of a substrate.

FIG. 10 is a sixth characteristic diagram showing an evaluation result of a titanium nitride film.

DETAILED DESCRIPTION

Figure 1:
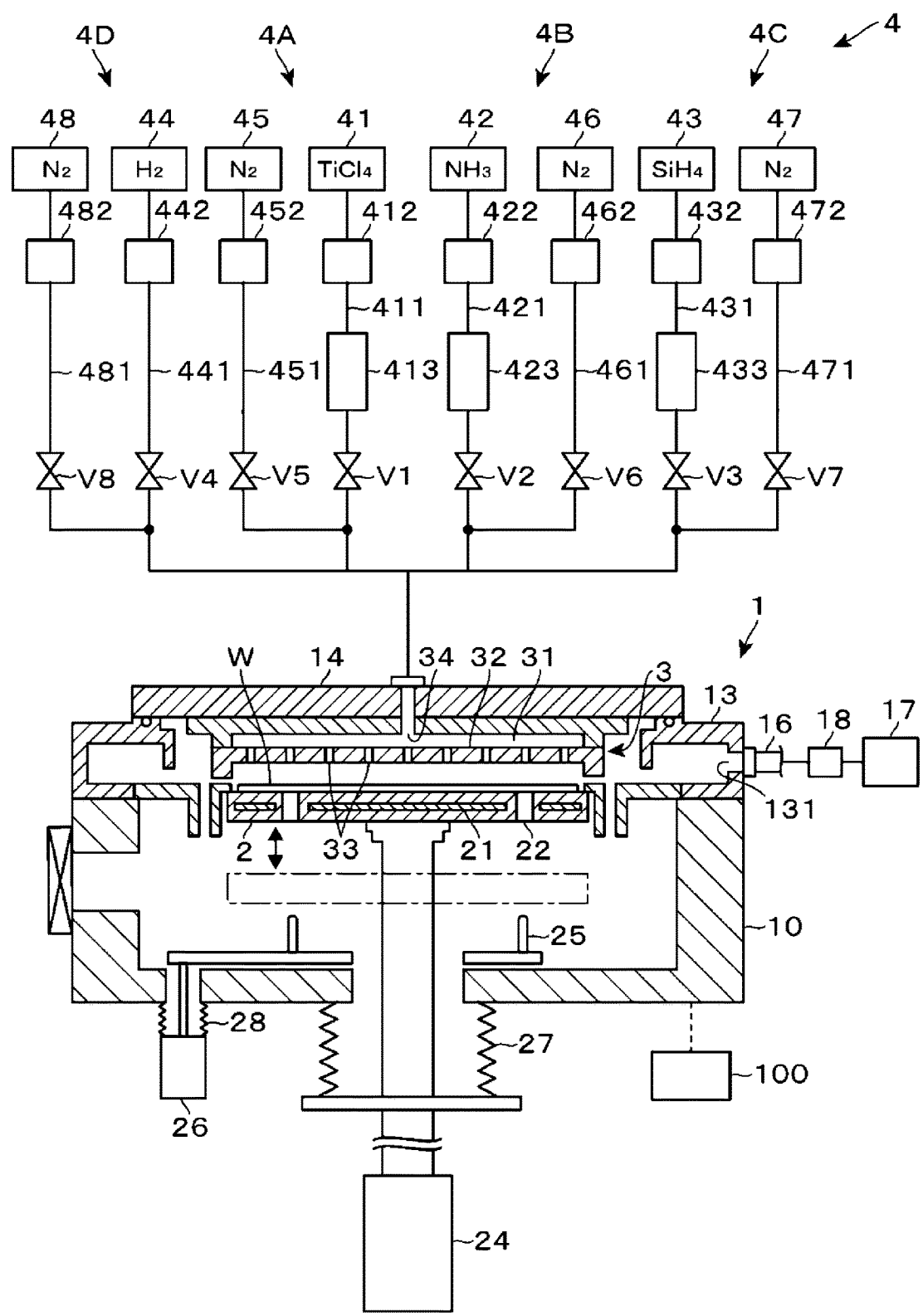
FIG. 1 is a vertical cross-sectional side view showing an example of a titanium nitride film forming apparatus according to the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Film Forming Apparatus>

An embodiment of an apparatus (hereinafter referred to as "film forming apparatus") for forming a titanium nitride film (TiN film) on a substrate will be described with reference to FIG. 1.

A film forming apparatus 1 includes a processing container 10 configured to accommodating a semiconductor wafer (hereinafter referred to as "wafer") W as a substrate. For example, an annular exhaust duct 13 is disposed above a side wall of the processing container 10. In addition, a top wall 14 is provided on an upper surface of the exhaust duct 13 so as to close an upper opening of the processing container 10. The processing container 10 is connected to a vacuum exhauster 17, which is formed by, for example, a vacuum pump, by a vacuum exhaust passage 16 via an exhaust port 131 of the exhaust duct 13.

An auto pressure controller (APC) valve 18 constituting a pressure regulator is installed in the vacuum exhaust passage 16. The APC valve 18 is formed by, for example, a butterfly valve, and is provided to open and close the vacuum exhaust passage 16. The APC valve 18 is configured to have a role of regulating a pressure in the processing container 10 by adjusting an open degree of the APC valve 18 to increase or decrease a conductance of the vacuum exhaust passage 16.

Inside the processing container 10, there is provided a stage 2 configured to horizontally support the wafer W and embedded with a heater 21 for heating the wafer W. The stage 2 is configured to be vertically movable by an elevating mechanism 24. In FIG. 1, the stage 2 located at a delivery position is indicated by a one-dot chain line. In FIG. 1, reference numeral 25 indicates support pins for delivering the wafer W, which are configured to be vertically movable by an elevating mechanism 26. Reference numeral 22 indicates through-holes for the support pins 25, and each of reference numerals 27 and 28 indicates a bellows that expands and contracts with the vertical movement of the stage 2 or the support pins 25.

In the processing container 10, a shower head 3 configured to supply a processing gas into the processing container 10 in a shower shape is provided to face the stage 2. The shower head 3 is provided with a gas diffusion space 31 therein, and a lower surface thereof is configured as a shower plate 32 having a plurality of gas discharge holes 33. A gas supply system 4 is connected to the gas diffusion space 31 via a gas introduction hole 34.

The gas supply system 4 includes a raw material gas supply 4A configured to supply a raw material gas to the processing container 10, a reaction gas supply 4B configured to supply a reaction gas to the processing container 10, an additive gas supply 4C configured to supply an additive gas to be added to the raw material gas to the processing container 10, and a hydrogen gas supply 4D configured to supply hydrogen gas as a purge gas for purging the raw material gas and the reaction gas. The raw material gas is a gas that contains a titanium compound containing chlorine (Cl) and titanium (Ti). For example, titanium tetrachloride ($TiCl_4$) is used as the titanium compound. The reaction gas is a gas that contains a nitrogen compound containing nitrogen (N) and reacting with the titanium compound to form titanium nitride (TiN). For example, ammonia ($NH_3$) is used as the nitrogen compound. In addition, the additive gas is a gas that contains a silicon compound reacting with chlorine contained in the titanium compound $TiCl_4$. Silane ($SiH_4$) is used as the silicon compound.

The raw material gas supply 4A includes a $SiCl_4$ gas source 41 and a supply path 411. For example, in the gas supply path 411, a flow rate adjuster 412, a storage tank 413, and a valve V1 are installed sequentially from an upstream side. In addition, the reaction gas supply 4B includes an $NH_3$ gas source 42 and a supply path 421. For example, in the gas supply path 421, a flow rate adjuster 422, a storage tank 423, and a valve V2 are installed sequentially from an upstream side. In addition, the additive gas supply 4C includes a $SiH_4$ gas source 43 and a supply path 431. For example, in the gas supply path 431, a flow rate adjuster 432, a storage tank 433, and a valve V3 are installed sequentially from an upstream side. The hydrogen gas supply 4D includes a $H_2$ gas source 44 and a supply path 441. For example, in the gas supply path 441, a flow rate adjuster 442 and a valve V4 are installed sequentially from an upstream side.

The $TiCl_4$ gas, the $NH_3$ gas, and the $SiH_4$ gas are temporarily stored in the storage tanks 413, 423, and 433, respectively, and supplied into the processing container 10 after pressures in the storage tanks 413, 423, and 433 are increased to predetermined pressures. A supply and stop of the respective gases from the storage tanks 413, 423, and 433 to the processing container 10 is performed by opening and closing the valves V1 to V3.

In addition, the gas supply system 4 includes an inert gas supply configured to supply an inert gas to the processing container 10. For example, nitrogen ($N_2$) gas is used as the inert gas. The inert gas supply of this example includes $N_2$ gas sources 45, 46, and 47 and supply paths 451, 461, and 471. In this example, the $N_2$ gas supplied from the source 45 is a purge gas for the $SiCl_4$ gas, and the source 45 is connected to the gas supply path 411 on a downstream side of the valve V1 via the gas supply path 451. Further, the $N_2$ gas supplied from the source 46 is a purge gas for the $NH_3$ gas, and the source 46 is connected to the gas supply path 421 on a downstream side of the valve V2 via the gas supply path 461. Further, the $N_2$ gas supplied from the source 47 is a purge gas for the $SiH_4$ gas, and the source 47 is connected to the gas supply path 431 on a downstream side of the valve V3 via the gas supply path 471. Further, the $N_2$ gas supplied from the source 48 is a purge gas supplied to the processing container 10 together with the $H_2$ gas, and the source 48 is connected to the gas supply path 421 on a downstream side of the valve V4 via the gas supply path 481. In FIG. 1, reference numerals 452, 462, 472, and 482 indicate flow rate adjusters, and reference numerals V5 to V8 indicate valves.

As will be described later, the $N_2$ gas supplied from the gas supply paths 451, 461, and 471 is a purge gas continuously supplied during a process of forming the TiN film. On the other hand, the $H_2$ gas supplied from the gas supply path 441 and the $N_2$ gas supplied from the gas supply path 481 are purge gases supplied in predetermined steps. Thus, in order to distinguish these purge gases, an operation of supplying the latter purge gases, that is, the $H_2$ gas and the $N_2$ gas, is referred to as flash purge, and the latter purge gases are also referred to as flash purge gases.

The film forming apparatus 1 includes a controller 100, which is composed of, for example, a computer. The controller 100 includes a data processor including a program, a memory, and a CPU. The program incorporates instructions (respective steps) for transmitting control signals from the controller 100 to respective components of the film forming apparatus 1 to proceed with the process of forming the TiN film described later. The program is stored in a storage, for example, a non-transitory computer-readable storage medium such as a flexible disk, a compact disk, a hard disk, or a magneto-optical (MO) disk, and installed in the controller 100. Specifically, the program controls operations of supplying the raw material gas, the reaction gas, and the inert gas in the film forming apparatus 1, regulating the pressure in the processing container 10, and the like.

<Film Forming Method>

Figure 2:
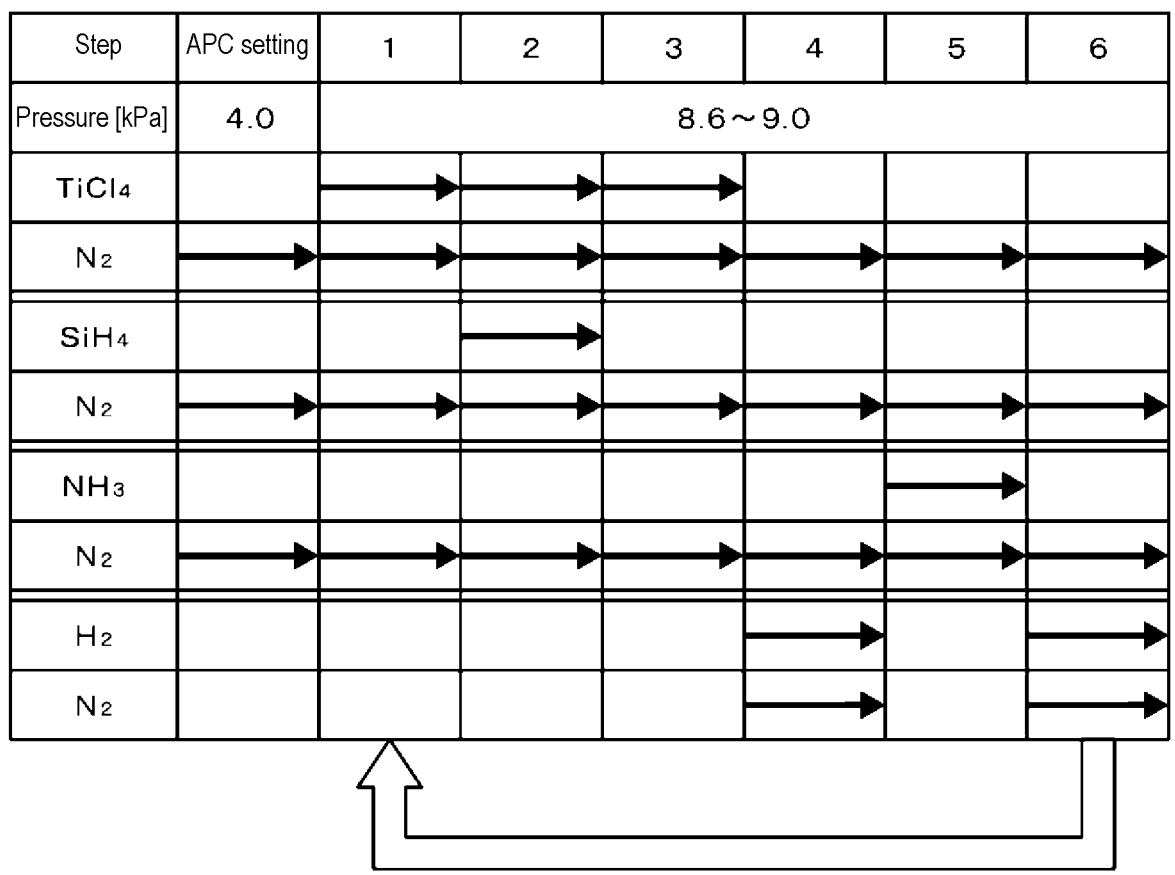
FIG. 2 is a diagram showing an example of a gas supply sequence of a titanium nitride film forming method according to the present disclosure.

Next, an example of a method of forming a TiN film according to the present disclosure will be described with reference to the gas supply sequence shown in FIG. 2. In this example, the TiN film is formed on one surface of the wafer W by an ALD method using the above-described film forming apparatus 1. The gas supply sequence of FIG. 2 shows supply timings of the $TiCl_4$ gas, the $SiH_4$ gas, the $NH_3$ gas, the $H_2$ gas, and the $N_2$ gas supplied into the processing container 10 and used for film formation. In FIG. 2, "$N_2$" below "$TiCl_4$" indicates the $N_2$ gas supplied from the source 45, "$N_2$" below "$SiH_4$" indicates the $N_2$ gas supplied from the source 47, "$N_2$" below "$NH_3$" indicates the $N_2$ gas supplied from the source 46, and "$N_2$" below "$H_2$" indicates the $N_2$ gas supplied from the source 48.

First, an APC setting step of adjusting the open degree of the APC valve 18 is performed. In this step, for example, the wafer W is loaded into the processing container 10 and placed on the stage 2, heating the wafer W by the heater 21 is started, and the $N_2$ gas is supplied from the sources 45, 46, and 47 into the processing container 10 at preset flow rates, respectively. Then, the inside of the processing container 10 is evacuated by the vacuum exhauster 17, and the open degree of the APC valve 18 is adjusted so that the pressure in the processing container 10 becomes, for example, 4.0 kPa (30 Torr). Following the APC setting step, a film forming step of forming the TiN film is performed. However, even in the film forming step, the open degree of the APC valve 18 is maintained at the open degree adjusted in the APC setting step. During the APC setting step, the wafer W placed on the stage 2 is heated to 600 degrees C., which is a temperature in a range of, for example, 400 degrees C. to 750 degrees C.

Subsequently, the film forming step of forming the TiN film, is performed based on the gas supply sequence of FIG. 2. The film forming step is composed of steps S1 to S6 described later. First, the valve V1 is opened to supply $TiCl_4$ gas, which is a raw material gas, into the processing container 10, and $N_2$ gas is supplied into the processing container 10 from the sources 45, 46, and 47 at preset flow rates, respectively. In the film forming step, the pressure in the processing container 10 is regulated to increase as described below. In this pressure regulation, a method of setting the flow rate of the $N_2$ gas to be larger than that in the APC setting step may be exemplified. Further, a small amount of hydrogen ($H_2$) gas may be supplied together with the $N_2$ gas. In particular, due to the supply of the $N_2$ gas, the pressure in the processing container 10 rises to, for example, 8.6 kPa (64.8 Torr) to 9.0 kPa (67.4 Torr). This pressure is maintained in the film forming step. With the pressure in the processing container 10 set as described above, the $TiCl_4$ gas is adsorbed on the entire surface of the wafer W (step S1).

Next, while keeping the valve V1 opened, the valve V3 is opened. During the period in which the $TiCl_4$ gas is being supplied into the processing container 10, and at a timing after the supply of the $TiCl_4$ gas is started, $SiH_4$ gas as an additive gas is supplied (step S2). As shown in experimental results described later, the $SiH_4$ gas contributes to improvement of a deposition rate of the TiN film while suppressing an increase in a specific resistance of the TiN film. A mechanism for estimating how these effects are achieved by adding the $SiH_4$ gas will be described later together with the experimental results.

Next, of the two valves in the open state, the valve V3 is closed to stop the supply of the $SiH_4$ gas (step S3). Then, after a predetermined time has elapsed, the other valve V1 is closed to stop the supply of the $TiCl_4$ gas. On the other hand, while continuously supplying the $N_2$ gas from the sources 45, 46, and 47, the valves V4 and V8 are opened to supply $N_2$ gas and $H_2$ gas for flash purge. As described above, the flash purge is performed to increase a supply flow rate of the $N_2$ gas, and the $SiCl_4$ gas remaining in the processing container 10 is removed. In addition, during the flash purge, by supplying the $H_2$ gas together with the $N_2$ gas, remaining chlorine (Cl) is caused to react with hydrogen and is removed as hydrogen chloride (HCl) (step S4). As will be described later, the removal of Cl by adding the $H_2$ gas also contributes to the reduction of the specific resistance of the TiN film.

Next, while continuously supplying the $N_2$ gas from the sources 45, 46, and 47, the valve V4 is closed to stop the supply of the $H_2$ gas, and the valve V2 is opened to supply $NH_3$ gas as a reaction gas into the processing container 10. As described above, the pressure in the processing container 10 is set to the pressure in the film forming step. Under this pressure, the $TiCl_4$ adsorbed on the wafer W reacts with the $NH_3$ to form the TiN film (step S5).

Subsequently, the valve V2 is closed to stop the supply of the $NH_3$ gas, the supply of the $N_2$ gas from the sources 45, 46, and 47 is continued, and the valve V8 is opened to increase the supply flow rate of the $N_2$ gas to perform the flash purge, thereby removing the $NH_3$ gas remaining in the processing container 10. Further, during the flash purge, the valve V4 is opened to supply the $H_2$ gas (step S6). As described above, in the film forming step, while supplying the $N_2$ gas as an inert gas into the processing container 10, the raw material gas and the reaction gas are alternately supplied, and the $H_2$ gas is supplied at the timing of the flash purge in which the raw material gas and the reaction gas are switched. These steps S1 to S6 are repeated a set number of times to form a TiN film having a desired thickness.

The TiN film 5 formed by the method of the present disclosure forms a wiring layer such as a word line of a DRAM or the like, and is embedded in a groove-shaped recess 52 formed in an insulating film 51 on one side of the wafer W, for example, as shown in FIG. 3. The TiN film 5 is deposited on an inner surface of a bottom and an inner surface of a side wall of the recess 52, and the embedment in the recess 52 proceeds by repeating steps S1 to S6 described above. The insulating film 51 is made of, for example, a silicon oxide film ($SiO_2$) film, and the recess 52 has a depth D of substantially 80 to 200 nm and an opening width W of substantially 10 to 20 nm. The insulating film 51 is formed so that a ratio D/W of the depth D and the opening width W is as large as substantially 5 to 20. In general, the recess 52 of the word line has a smaller aspect ratio than a recess that forms a via hole. Therefore, a resistance value is lowered by embedding TiN in the recess 52 rather than tungsten. As described above, by embedding a TiN wiring layer in the recess 52, the formed TiN film tends to be thick.

In a process of manufacturing a DRAM, after the TiN film 5 embedded in the recess 52 is formed, an annealing process is performed for the purpose of diffusing impurities and the like. In some cases, micro-voids, which are small voids, may be formed in the formed TiN film 5. Further, a more number of micro-voids 53 may be additionally formed in the TiN film even by heating such as the annealing process or the like performed after the film formation. If the plurality of micro-voids 53 is generated in the TiN film used as the wiring layer as described, a current flow may become poor and a specific resistance of the TiN wiring layer may increase, which may adversely affect operations of a device.

It is thought that the micro-voids 53 formed by heating the wafer W are generated when minute gaps are formed between adjacent grains as the grains (crystal grains) in the TiN film 5 grow by the annealing process. Further, as will be described later, it is known that when a TiN film is formed by using a raw material gas containing Cl such as $TiCl_4$ or the like, a plurality of micro-voids 53 tends to be generated by the annealing process. Therefore, it is thought that reducing a concentration of Cl impurities in the TiN film is effective in suppressing the micro-voids 53 from being generated.

From this background, the inventors of the present disclosure have attempted to discharge Cl-containing components such as unnecessary $TiCl_4$ gas, reaction by-products of the film forming reaction, and the like from the processing container 10 by prolonging a purge time (flash purge time) performed by the $N_2$ gas and the $H_2$ gas in steps S4 and S6 described above. As a result, it was confirmed that by prolonging the purge time by about five times, it is possible to form a TiN film having a low Cl content and it is also effective in suppressing the micro-voids 53 from being generated during the annealing process. However, in the process of embedding the TiN film 5 in the recess 52 described above, the film thickness of the TiN film 5 is as large as 15 nm to 20 nm, and the number of cycle repetitions is large. Therefore, when the purge time is prolonged, a total processing time of the film forming process becomes long, and a significant decrease in productivity is unavoidable.

Thus, the present inventors reviewed again processing conditions in the process of forming the TiN film in order to form the TiN film 5 having a low specific resistance by a method other than the method of increasing the purge time.

Conventionally, when a TiN film is formed by an ALD method, it is typical that the film is formed under a condition that the pressure in the processing container 10 is 1.33 kPa (10 Torr) or less. In the ALD method, in order to form the TiN film by causing $TiC_4$ adsorbed on one surface of the wafer W to react with $NH_3$, it is required to purge a raw material gas as fast as possible, so that film forming reaction by a CVD method in which $TiCl_4$ and $NH_3$ are reacted in gas phases does not proceed. It was considered as common sense to carry out the ALD film forming method under a low-pressure condition because it takes time to purge when the pressure in the processing container 10 is increased.

On the contrary, the present inventors have carried out a process of forming a TiN film by changing the pressure in the processing container 10 over a wide range. As a result, the present inventors have found that an optimum pressure range in which a specific resistance of the TiN film becomes low exists on a higher-pressure side than the conventional pressure condition. How the pressure condition has been optimized will be described below.

Figure 4:
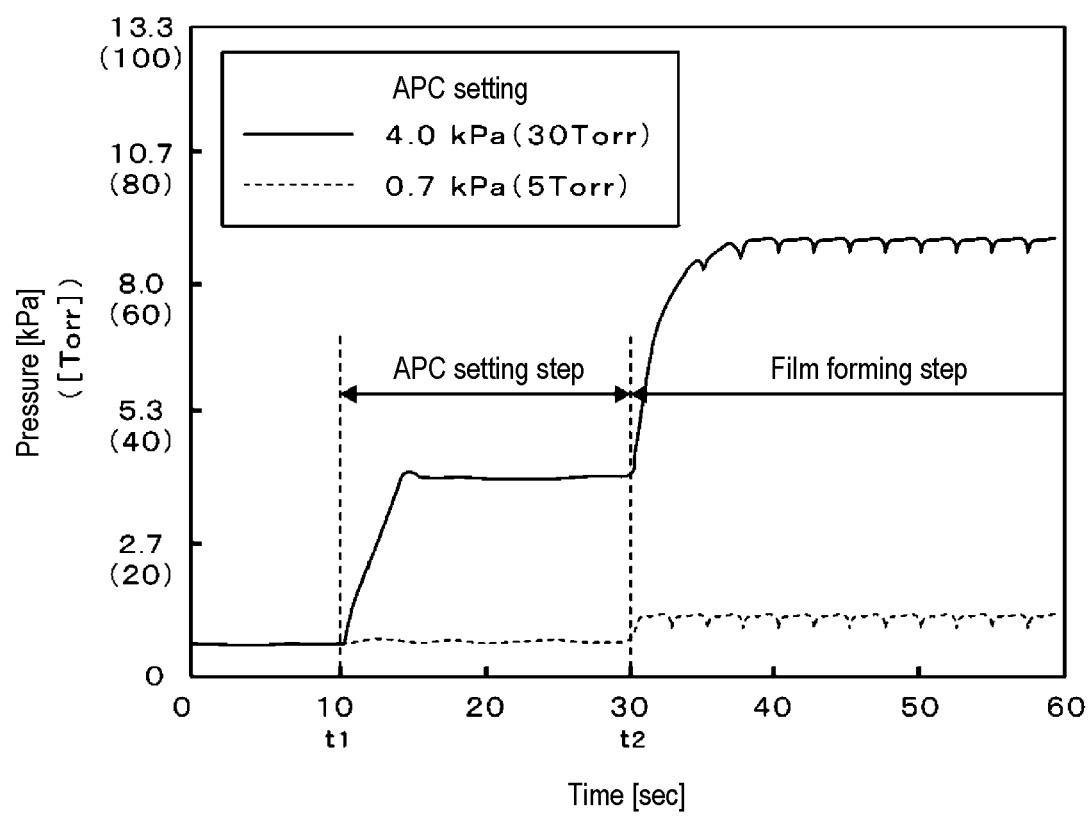
FIG. 4 is a characteristic diagram for explaining a pressure condition of the film forming method.

First, a pressure in the processing container 10 in the process of forming the TiN film will be described with reference to FIG. 4. In FIG. 4, the vertical axis indicates the pressure in the processing container 10, and the horizontal axis indicates an elapsed time. Further, in FIG. 4, the pressure in the film forming process of the present disclosure is indicated by a solid line, and the pressure condition of 1.33 kPa (10 Torr) or less, which has been conventionally used, is indicated by a dotted line.

The film forming process of the present disclosure of the example shown in FIG. 4 will be described. As described above, this film forming process includes the APC setting step and the film forming step. At time t1, $N_2$ gas is supplied from the sources 45, 46, and 47 at 7.5 slm (liter/min, standard state (1 atmospheric and 0 degrees C.)) to start the APC setting step. Then, the open degree of the APC valve 18 is fixed in a state in which the pressure in the processing container 10 is stable (4.0 kPa (30 Torr)), and the APC setting step ends at time t2.

Subsequently, at time t2, the above-described film forming step is started. In the film forming step, as described above, the pressure in the processing container 10 is increased to 8.6 kPa (64.8 Torr) to 9.0 kPa (67.4 Torr) by, for example, setting the flow rate of the $N_2$ gas larger than that in the APC setting step. During the film forming step in which the above-mentioned steps S1 to S6 are repeated, the pressure drops by about 0.3 kPa to 0.4 kPa when supplying the $TiCl_4$ gas in step S1, and the pressure rises again by about 0.3 kPa to 0.4 kPa in steps S2 to S6. As described above, the reason why the pressure is slightly reduced intermittently when supplying the $TiCl_4$ gas is that the flow rate of the $N_2$ gas is reduced only when supplying the $TiCl_4$ gas.

On the other hand, even in the film forming process under the conventional pressure condition, the film forming process is carried out in the same manner as described above except that the set pressure is changed. Therefore, at time t1, $N_2$ gas is supplied at 2.5 slm to start the APC setting step. Then, in a state in which the pressure in the processing container 10 is stable (0.67 kPa (5 Torr)), the open degree of the APC valve 18 is fixed, and the film forming step described above is started at time t2. In the film forming step, formation of the TiN film is executed in a state in which the pressure in the processing container 10 rises from 0.96 kPa (7.2 Torr) to 1.09 kPa (8.2 Torr).

Figure 5:
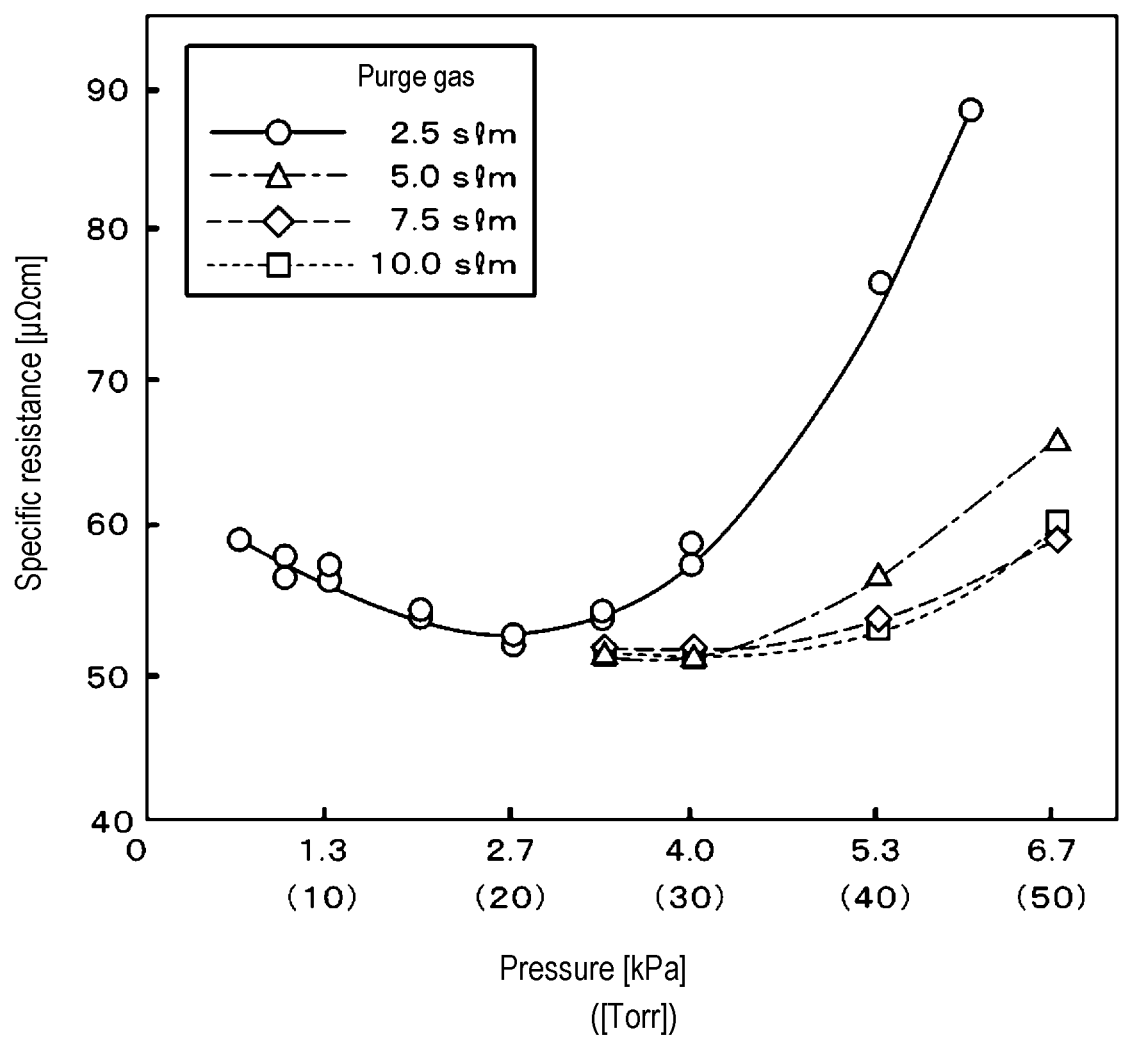
FIG. 5 is a first characteristic diagram showing an evaluation result of a titanium nitride film.

Subsequently, FIG. 5 will be described. FIG. 5 is a characteristic diagram (first characteristic diagram) showing a relationship between the pressure in the processing container 10 and the specific resistance of the TiN film. FIG. 5 shows results of executing the above-mentioned film forming process by changing the pressure in the APC setting step and measuring the specific resistance of the formed TiN film. In FIG. 5, the vertical axis indicates the specific resistance of the TiN film, and the horizontal axis indicates the pressure in the processing container 10 in the "APC setting step." Further, in FIG. 5, data when a purge gas flow rate is 2.5 slm is plotted by circles, data when the purge gas flow rate is 5.0 slm is plotted by triangles, data when the purge gas flow rate is 7.5 slm is plotted by diamonds, and data when the purge gas flow rate is 10.0 slm is plotted by squares.

Further, a setting example of a supply flow rate of each gas is as follows. The supply flow rate of the $TiCl_4$ gas is 34 sccm, the supply flow rate of the $NH_3$ gas is 600 sccm, the supply flow rate of the $SiH_4$ gas is 250 sccm, and the supply flow rate of the $N_2$ gas continuously supplied from the supply paths 451 and 461, and 471 is, for example, a value obtained by dividing each of the above-mentioned purge gas flow rates into three equal parts. In addition, the supply flow rate of the $N_2$ gas for flash purge in steps S4 and S6 is 18,000 sccm, and the supply flow rate of the $H_2$ gas for flash purge is 7,000 sccm. The execution time of each of steps S1 to S3 and S5 is set to 0.05 seconds, the execution time of purging in each of steps S4 and S6 is set to about 1 second, and the execution time of one cycle including steps S1 to S6 is set to 2.5 seconds.

In the film forming step of forming the TiN film, steps S1 to S6 were repeated as described above to form a TiN film having a film thickness of 15 nm. The time required to carry out a series of steps S1 to S6 was set to 2.5 seconds. The specific resistance of the formed TiN film was specified based on a film thickness measurement result of the TiN film obtained by an ellipsometer and a sheet resistance value obtained by a 44-probe method.

Although the pressure in the processing container 10 in the film forming step is omitted in FIG. 5, examples of a corresponding relationship is as follows. When the purge gas flow rate is 2.5 slm and the pressure in the APC setting step is 5.3 kPa, the pressure in the film forming step is 8.8 kPa. When the purge gas flow rate is 5.0 slm and the pressure in the APC setting step is 5.3 kPa, the pressure in the film forming step is 10.4 kPa. When the purge gas flow rate is 7.5 slm and the pressure in the APC setting step is 5.3 kPa, the pressure in the film forming step is 11.8 kPa.

As described above, the pressure in the film forming step varies depending on the flow rates of the $TiCl_4$ or $NH_3$ gas and the purge gas ($N_2$ gas). However, in any case, the pressure in the film forming step is about twice the pressure in the APC setting step. Therefore, by doubling the indication value of the pressure condition in the APC setting step indicated on the horizontal axis of FIG. 4, it is possible to recognize a correspondence relationship between the specific resistance and the pressure in the film forming step. That is, it can be said that a tendency of change in the specific resistance of the TiN film with respect to a change in the pressure in the film forming step is almost similar to a tendency of change in the specific resistance with respect to the change in the pressure in the APC setting step shown in FIG. 4. This also applies to the cases of FIGS. 6 to 8 described later.

From the results of FIG. 5, it is confirmed that the specific resistance of the TiN film varies depending on the pressure in the APC setting step, i.e., the pressure in the film forming step. Focusing on the film forming condition where the purge gas flow rate is 2.5 slm, the specific resistance decreases as the pressure in the APC setting step increases from 0.67 kPa (5 Torr). In addition, it can be seen that the specific resistance is lowest at the pressure of 2.7 kPa (20 Torr) but, at the pressure higher than 2.7 kPa (20 Torr), the specific resistance increases as the pressure increases.

Further, it is confirmed that even under the film forming conditions where the purge gas flow rates are 5 slm, 7.5 slm, and 10 slm, respectively, the specific resistance of the TiN film varies depending on the pressure in the APC setting step, and under these conditions, the specific resistance is lowest, i.e., 51.6 micro-ohm-cm when the pressure is 4.0 kPa (30 Torr). Further, when the pressure is the same, the specific resistance tends to be smaller as the purge gas flow rate increases. However, it can be also recognized that a decrease amount of the specific resistance with respect to an increase amount of the purge gas flow rate tends to gradually decrease to be saturated.

As described above, it is recognized that in order to reduce the specific resistance of the TiN film, there is an optimum condition for the pressure in the film forming step. Under the conventional pressure condition shown in FIG. 4, since the pressure in the APC setting step is 6.65 kPa (5 Torr), the specific resistance of the formed TiN film is about 59 micro-ohm-cm. However, in the present disclosure, it is attempted to form a TiN film having a specific resistance of 57 micro-ohm-cm or less, which is lower than the specific resistance obtained under the conventional pressure condition.

The present inventors have formed the TiN film by changing the pressure conditions in the processing container 10 in various ways as described above. As a result, according to the data shown in FIG. 5, it was recognized that when the pressure in the film forming step is within a range of 2.7 kPa (20 Torr) to 12.6 kPa (95 Torr), the specific resistance of the formed TiN film is 57 micro-ohm-cm or less in many cases. However, as shown in FIG. 5, the specific resistance of the TiN film also varies depending on the flow rate of the purge gas. Therefore, in the present disclosure, it is required to form a TiN film under a condition that the pressure in the film forming step is within the range of 2.7 kPa (20 Torr) to 12.6 kPa (95 Torr) and the specific resistance of the formed TiN film is 57 micro-ohm-cm or less. Such a condition can be recognized in advance by, for example, conducting a preliminary experiment described above with reference to FIG. 5.

As described above, according to the aforementioned embodiment, it is possible to reduce the specific resistance of the TiN film formed by the ALD method while suppressing the purge time from being prolonged. Further, as described below, it is possible to obtain a secondary effect of increasing a deposition rate of the TiN film by increasing the pressure during the film forming step.

Figure 6:
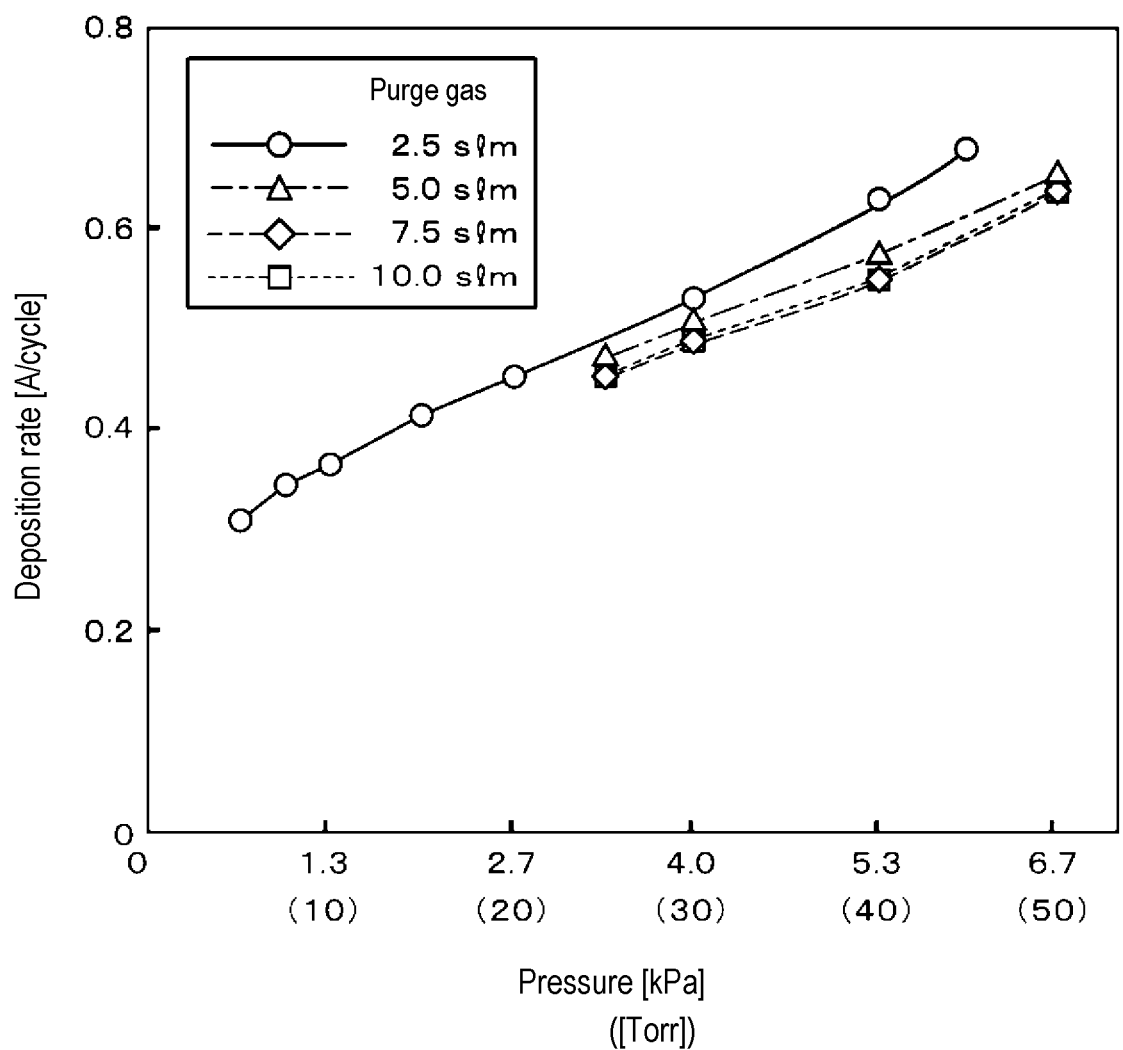
FIG. 6 is a second characteristic diagram showing an evaluation result of a titanium nitride film.

FIG. 6 is a characteristic diagram (second characteristic diagram) showing a relationship between the pressure in the processing container 10 and the deposition rate of the TiN film. FIG. 6 shows results of performing the same TiN film forming process as that of FIG. 5 by changing the pressure in the APC setting step and measuring the deposition rate of the formed TiN film. In FIG. 6, the vertical axis indicates the deposition rate of the TiN film, and the horizontal axis indicates the pressure in the processing container 10 in the APC setting step. Further, in FIG. 6, data when the purge gas flow rate is 2.5 slm is plotted by circles, data when the purge gas flow rate is 5.0 slm is plotted by triangles, data when the purge gas flow rate is 7.5 slm is plotted by diamonds, and data when the purge gas flow rate is 10.0 slm is plotted by squares.

From the results of FIG. 6, it is recognized that the deposition rate of the TiN film increases as the pressure in the APC setting step, that is, the pressure in the film forming step increases. However, it is also recognized that a decrease amount of the deposition rate with respect to an increase amount of the purge gas flow rate gradually becomes smaller to be saturated. In addition, it can be recognized that under the film forming conditions where the purge gas flow rates are 5 slm, 7.5 slm, and 10 slm, respectively, the deposition rate with respect to the pressure is almost the same.

Based on the data of the condition of the purge gas flow rate of 2.5 slm in FIG. 5 (first characteristic diagram) and FIG. 6 (second characteristic diagram) described above, the following can be said. When the pressure in the APC setting step is 1.3 kPa to 3.6 kPa, i.e., the pressure in the film forming step is within the range of about 2.7 kPa to 7.2 kPa, the specific resistance of the TiN film is 57 micro-ohm-cm or less. On the other hand, at the pressures outside this range, the specific resistance tends to increase sharply. In addition, the deposition rate increases along with the increase in pressure regardless of the pressure range.

From the reasons described above, when the pressure in the film forming step is within the range of 2.7 kPa to 7.2 kPa, the formation of the TiN film by ALD is more likely to proceed, and a deposition amount of the TiN film formed in one cycle is increased. Further, it is thought that a denser TiN film having a low content of Cl as an impurity is formed.

On the contrary, when the pressure in the APC setting step becomes higher than 3.6 kPa, the specific resistance increases as the pressure increases. It is thought that the reason is because when the pressure exceeds 3.6 kPa, a ratio of a TiN film formed by ALD and a TiN film formed by CVD in which $TiCl_4$ and $NH_3$ react in gas phases increases.

Figure 7:
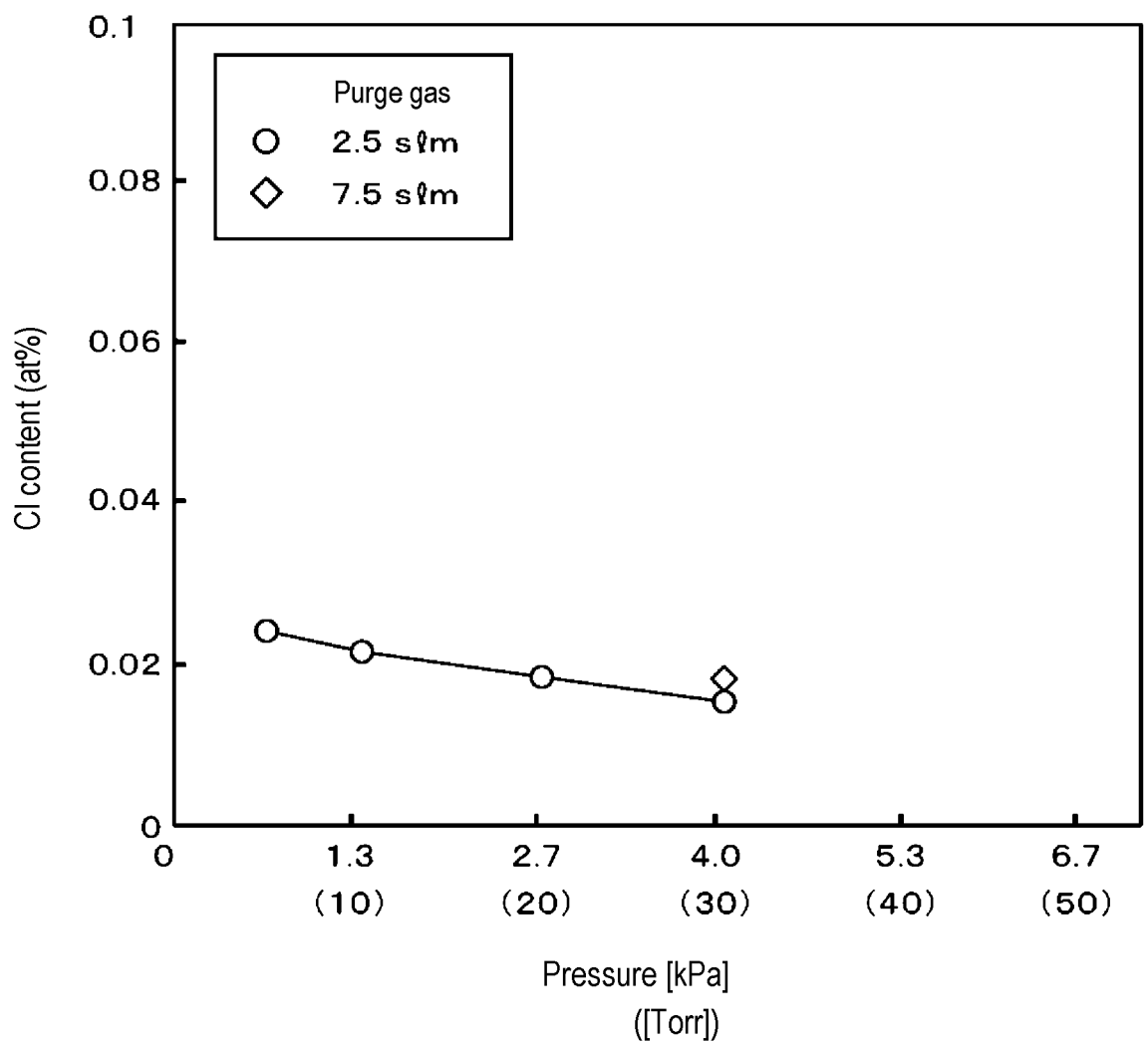
FIG. 7 is a third characteristic diagram showing an evaluation result of a titanium nitride film.

As described above, a mechanism of improvement of the specific resistance of the TiN film by the pressure during the film forming step is not clear. However, as shown in FIG. 7 described below, it is experimentally confirmed that the Cl content of the TiN film is reduced. Therefore, it is thought that Cl is likely to be separated from a surface of the TiN film in an atmosphere where the pressure is high and $H_2$ gas is present.

FIG. 7 is a characteristic diagram (third characteristic diagram) showing a relationship between the pressure in the processing container 10 and the Cl content of the TiN film. FIG. 7 shows results obtained by performing the same film forming process as shown in FIG. 5 by changing the pressure in the APC setting step and measuring the Cl content of the formed TiN film.

The Cl content (at %) of the TiN film indicates a measurement result of a ratio of Cl atoms in the TiN film by secondary ion mass spectrometry (SIMS). In FIG. 7, the vertical axis indicates the Cl content, and the horizontal axis indicates the pressure in the processing container 10 in the APC setting step. In addition, data when the purge gas flow rate is 2.5 slm is plotted by circles, and data when the purge gas flow rate is 7.5 slm is plotted by diamonds.

According to the data when the purge gas flow rate is 2.5 slm, it can be recognized that when the pressure in the APC setting step is within a range of 0.67 kPa (5 Torr) to 4.0 kPa (30 Torr), the Cl content of the formed TiN film gradually decreases as the pressure increases. Therefore, by increasing the pressure in the APC setting step, that is, the pressure in the film forming step, it is possible to reduce an amount of Cl introduced into the TiN film during formation of the TiN film. As a result, it is thought that suppression of generation of micro-voids leads to a decrease in the specific resistance.

Figure 8:
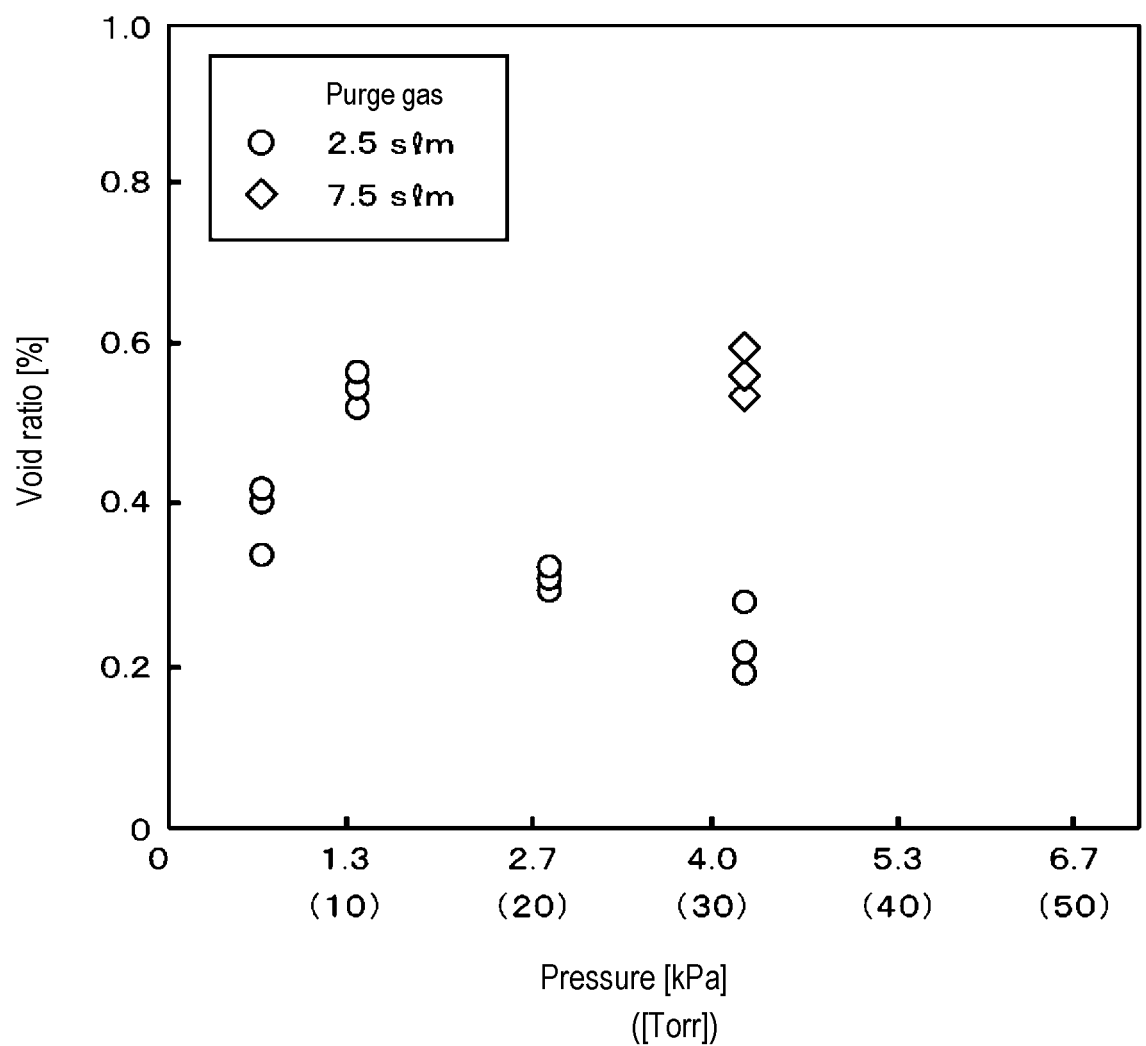
FIG. 8 is a fourth characteristic diagram showing an evaluation result of a titanium nitride film.

Actually, results shown in FIG. 8 (fourth characteristic diagram) were obtained by investigating a relationship between the pressure in the processing container 10 and a void ratio of the TiN film. FIG. 8 shows results of performing the same film forming process as in FIG. 5 by changing the pressure in the APC setting step and measuring the void ratio after the annealing process of the formed TiN film. The annealing process conditions are 750 degrees C., two hours, and $N_2$ atmosphere. The void ratio was determined by performing transmission electron microscope (TEM) observation of a sample processed parallel in a trench shape and performing image processing to calculate a ratio of an area where a void portion appears white from the entire area. In FIG. 8, the vertical axis indicates the void ratio, and the horizontal axis indicates the pressure in the processing container 10 in the APC setting step. In addition, data when the purge gas flow rate is 2.5 slm is plotted by circles, and data when the purge gas flow rate is 7.5 slm is plotted by diamonds.

From the data when the purge gas flow rate is 2.5 slm, it can be recognized that when the pressure in the APC setting step is within a range of 1.3 kPa (10 Torr) to 4.0 kPa (30 Torr), the void ratio of the formed TiN film decreases as the pressure increases. As described above, a correlation is observed between the Cl content and the void ratio of the TiN film. By increasing the pressure in the APC setting step, i.e., the pressure in the film forming step, the amount of Cl introduced into the TiN film during the formation of the TiN film is reduced. As a result, the generation of voids is suppressed.

Figure 9:
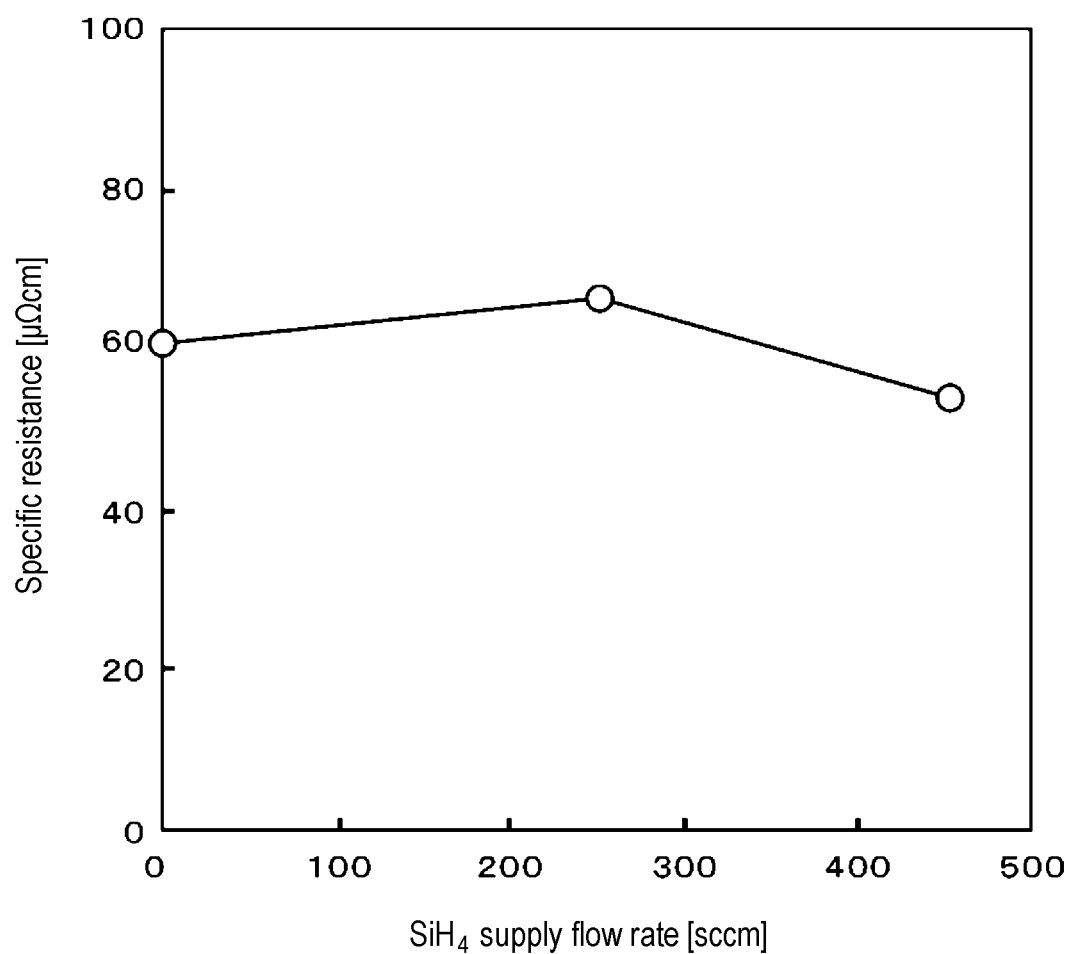
FIG. 9 is a fifth characteristic diagram showing an evaluation result of a titanium nitride film.

Further, FIGS. 9 and 10 show an example in which the supply flow rate of the $SiH_4$ gas in step S2 is changed to check the influence of adding the $SiH_4$ gas, and the influence on the specific resistance and the deposition rate of the TiN film is checked. A total flow rate of the purge gas ($N_2$ gas) continuously supplied from the supply paths 451, 461, and 471 is set to 7.5 slm, and the pressure in the processing container 10 is set to 5.3 kPa (40 Torr).

In FIGS. 9 and 10, a plot when the supply flow rate of $SiH_4$ gas is 450 sccm indicates film formation performed under the same processing condition as the plot of the diamond shape at the pressure of 5.3 kPa (40 Torr) shown in FIGS. 5 and 6. When the supply flow rate of the $SiH_4$ gas is reduced to 250 sccm and 0 sccm, the specific resistance tends to increase slightly (see FIG. 9). In addition, the deposition rate tends to decrease as the supply flow rate of the $SiH_4$ gas decreases (see FIG. 10).

As described above, the mechanism of reducing the specific resistance of the TiN film and improving the deposition rate by supplying the $SiH_4$ gas as the additive gas is not clear. This is estimated as follows. When supplying the $TiCl_4$ gas in steps S1 to S3, $TiCl_4$ is adsorbed on a layer of Ti—$NH_2$ formed in the previous cycle, and Ti—N—Ti—$Cl_X$ is formed on the surface of the film. It is thought that this Ti—N—Ti—$Cl_X$ suppresses formation of adsorption sites for $TiCl_4$ supplied in the next cycle. At this time, if the $SiH_4$ gas, which is a silicon compound that reacts with Cl contained in Ti—N—Ti—$Cl_X$, is added to the $TiCl_4$ gas, Ti—N—Ti—$H_X$ is formed on the surface of the film, and Cl is separated from the film by forming a compound of $SiH_YCl_{(4-Y)}$. Since Ti—N—Ti—$H_X$ is considered to have a smaller effect of inhibiting formation of adsorption sites than Ti—N—Ti—$Cl_X$, it is possible to suppress newly adsorption of $TiCl_4$ from being inhibited. It is thought that, for example, due to the above-mentioned reaction mechanism, many adsorption sites are formed on the surface of the film while suppressing residual of Cl in the TiN film, and the deposition rate of the TiN film is improved.

However, when Si of $SiH_4$ is introduced into the TiN film, SiN as an insulating material is formed, which causes an increase in the specific resistance of the TiN film. Therefore, as described with reference to FIG. 2, the timing for starting the supply of the $SiH_4$ gas is set to a timing after the supply of the $TiCl_4$ gas is started (steps S1 and S2). As a result, it is possible to sufficiently adsorb $TiCl_4$ on the surface of the film and then proceed with the reaction with $SiH_4$, and it is possible to suppress Si from being introduced into the TiN film.

In addition, the timing for stopping the supply of the $SiH_4$ gas is set to a timing before the supply of the $TiCl_4$ gas is stopped. Thus, it is possible to reduce the residual amount of $SiH_4$ in the processing container 10, and it is possible to obtain the effect of suppressing Si from being introduced into the TiN film.

However, it is not an essential requirement to start the supply of the $SiH_4$ gas after starting the supply of the $TiCl_4$ gas and to stop the supply of the $SiH_4$ gas before stopping the supply of the $TiCl_4$ gas. For example, as long as the specific resistance of the TiN film is 57 micro-ohm-cm or less as described above, the supply of the $TiCl_4$ gas and the supply of the $SiH_4$ gas may be stopped at the same time, and the start timings of supplying the two gases may also be set to the same timing.

Further, in the example shown in FIG. 9, the specific resistance of the TiN film is around 60 micro-ohm-cm, which is larger than the target value of 57 micro-ohm-cm. However, as described above, the specific resistance of the TiN film is also changed depending on other processing conditions such as the purge gas flow rate and the like. The results shown in FIG. 9 indicate that the specific resistance does not change as much as the deposition rate shown in FIG. 10 even when the flow rate of the additive $SiH_4$ gas is changed. Therefore, when the conditions are such that a TiN film having a specific resistance of 57 micro-ohm-cm or less can be formed, the supply flow rate of the $SiH_4$ gas may be set to a flow rate lower than 450 sccm as long as the required deposition rate can be obtained (including a case where the supply flow rate of the $SiH_4$ gas is 0 sccm). On the contrary, in order to achieve a higher deposition rate, the supply flow rate of the $SiH_4$ gas may be increased to more than 450 sccm within a range in which the influence on introduction of Si into the TiN film does not increase.

As described above, according to the present disclosure, it is possible to form a TiN film having a low specific resistance by optimizing the pressure condition in the film forming step. It is also possible to increase the deposition rate of the TiN film. Therefore, it is possible to suppress steps S4 and S6 of purging the raw material gas and the reaction gas from being prolonged. Further, by increasing the deposition rate, it is possible to reduce the number of repetitions of the cycle of the film forming step (steps S1 to S6) until a target film thickness is reached, as compared with the conventional case. Therefore, it is possible to contribute to shortening the total processing time of the film forming process and improve the productivity. By optimizing the pressure condition in the film formation step as described above, it is possible to reduce the specific resistance of the TiN film and improve the deposition rate. Therefore, it is possible to significantly improve the productivity by using existing equipment.

In the foregoing, as the titanium compound of the raw material gas, in addition to titanium tetrachloride (TiCl$_4$), a titanium trichloride (TiCl$_3$) gas, a titanium dichloride (TiCl$_2$) gas, a titanium tetrabromide (TiBr$_4$) gas, or a titanium tetraiodide (TiI$_4$) gas may be used.

Further, as the nitrogen compound of the reaction gas, in addition to ammonia, hydrazine (N$_2$H$_4$), monomethylhydrazine (CH$_3$NH—NH$_2$) or a nitrogen radical may be used.

Further, as the silicon compound of the additive gas that reacts with chlorine contained in the titanium compound, in addition to silane (SiH$_4$), disilane (Si$_2$H$_6$) may be used. However, when an increase in specific resistance does matter, it is desirable to avoid silicon compounds containing Cl, such as SiH$_2$Cl$_2$ and the like. In addition, as the inert gas, in addition to the nitrogen gas, an argon (Ar) gas or a helium (He) gas may be used.

In the above-described embodiment, the open degree of the APC valve 18 is set so that the set pressure in the APC setting step is set lower than that in the film forming step. However, the present disclosure is not limited to this example. In the APC setting step, the supply amount of the inert gas may be set to the same level as in the film forming step, and the open degree of the APC valve 18 may be set so that the pressure in the processing container 10 is regulated to the pressure within the range of 2.7 kPa to 12.6 kPa, which is the pressure in the film forming step.

Further, the pressure regulation during the film forming step may be performed not only by controlling the flow rates of the raw material gas, the reaction gas, and the inert gas, but also in combination with the adjustment of the open degree of the APC valve 18. For example, in the above-described example, the inert gas is supplied in the step of forming the TiN film. However, when supplying the raw material gas or the reaction gas, the supply of the inert gas may be stopped and the open degree of the APC valve 18 may be changed to regulate the pressure in the processing container 10 as described above. In addition, it is not an essential requirement to perform the flash purge that simultaneously supplies the N$_2$ gas and the H$_2$ gas. As long as a TiN film having a specific resistance of 57 micro-ohm-cm or less can be obtained, for example, flash purge may be performed only by the N$_2$ gas. Further, only the purge by the constantly-supplied N$_2$ gas may be performed without performing the flash purge.

Further, the apparatus for forming the TiN film is not limited to the configuration shown in FIG. 1. For example, a batch-type film forming apparatus that simultaneously forms films on a plurality of wafers W may be used. In this case as well, when forming a TiN film by an ALD method, the film forming step can be performed under a pressure condition, which is within a range of 2.7 to 12.6 kPa and obtains the specific resistance of the TiN film is 57 micro-ohm-cm or less.

<Other Applications>

It should be noted that the embodiments disclosed herein are exemplary in all respects and are not limitative. The above-described embodiments may be omitted, replaced, modified or combined in various forms without departing from the scope of the appended claims and their gist.

According to the present disclosure in some embodiments, it is possible to form a titanium nitride film having a low specific resistance.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a titanium nitride film, comprising:
    adjusting an open degree of an APC (auto pressure controller) valve; and
    forming the titanium nitride film by alternately repeating supplying a raw material gas, which contains a titanium compound including chlorine and titanium, to a substrate accommodated in a processing container, and supplying a reaction gas, which contains a nitrogen compound including nitrogen and reacts with the titanium compound to form titanium nitride, to the substrate,
    wherein the forming the titanium nitride film is executed under a condition in which a pressure in the processing container is set within a range of 2.7 kPa to 12.6 kPa so that a specific resistance of the titanium nitride film becomes 57 micro-ohm-cm or less, and
    wherein the pressure in the processing container during the forming the titanium nitride film is about twice a pressure in the processing container during the adjusting the open degree of the APC valve.

2. The method of claim 1, wherein the titanium compound is titanium tetrachloride.

3. The method of claim 2, wherein the nitrogen compound is ammonia.

4. The method of claim 3, wherein the forming the titanium nitride film further includes supplying an additive gas, which contains a silicon compound that reacts with chlorine contained in the titanium compound, during a period of supplying the raw material gas to the substrate.

5. The method of claim 4, wherein a start timing of the supply of the additive gas is after the supply of the raw material gas is started.

6. The method of claim 5, wherein the silicon compound is silane.

7. The method of claim 4, wherein the silicon compound is silane.

8. The method of claim 1, wherein the nitrogen compound is ammonia.

9. The method of claim 1, wherein the forming the titanium nitride film further includes supplying an additive gas, which contains a silicon compound that reacts with chlorine contained in the titanium compound, during a period of supplying the raw material gas to the substrate.

10. The method of claim 1, wherein the forming the titanium nitride film is executed under a condition that the substrate is heated to a temperature within a range of 400 degrees C. to 750 degrees C.

11. The method of claim 1, wherein the forming the titanium nitride film is executed while supplying an inert gas into the processing container.

12. The method of claim 11, wherein hydrogen gas is supplied together with the inert gas at a timing when the supply of the raw material gas and the supply of the reaction gas are switched.

* * * * *